(12) United States Patent
Fujiwara et al.

(10) Patent No.: US 6,429,090 B1
(45) Date of Patent: Aug. 6, 2002

(54) FIDUCIAL MARK BODIES FOR CHARGED-PARTICLE-BEAM (CPB) MICROLITHOGRAPHY, METHODS FOR MAKING SAME, AND CPB MICROLITHOGRAPHY APPARATUS COMPRISING SAME

(75) Inventors: Tomoharu Fujiwara; Noriyuki Hirayanagi, both of Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/513,308

(22) Filed: Feb. 25, 2000

(30) Foreign Application Priority Data

Mar. 3, 1999 (JP) .............................. 11-055367
Jun. 2, 1999 (JP) .............................. 11-155192

(51) Int. Cl.[7] .............................................. H01L 21/76
(52) U.S. Cl. .......................................... 438/401; 438/4
(58) Field of Search ................. 438/401, 947, 438/949, 975, 4, 14, 15, 16, 17, 18, 462, 800; 430/22, 30, 270, 296, 942

(56) References Cited

U.S. PATENT DOCUMENTS 6,059,981 A * 5/2000 Nakasuji .................... 216/2
6,171,736 B1 * 1/2001 Hirayanagi ................. 430/22
6,287,876 B1 * 9/2001 Fujiwara ..................... 438/4

OTHER PUBLICATIONS

Niedrig, H., "Electron Backscattering From Thin Films," *J. Appl. Phys.* 53:R15–R49 (1982).

* cited by examiner

Primary Examiner—David Nelms
Assistant Examiner—Phuc T. Dang
(74) Attorney, Agent, or Firm—Klarquist Sparkman LLP

(57) ABSTRACT

Fiducial mark bodies are provided for use in CPB microlithography apparatus and methods. Such bodies are especially useful for attachment to the wafer stage of such apparatus, for measuring a distance between a reference position of the CPB-optical system of the apparatus and a reference position of an optical-based alignment sensor of the apparatus. The mark bodies provide improved accuracy of these and other positional measurements. A typical mark body is made of a substrate plate (e.g., quartz or quartz-ceramic) having a low coefficient of thermal expansion. Mark elements are defined on the substrate plate by a layer of heavy metal (e.g. are Ta, W, or Pt). The mark body includes a surficial or interior layer of an electrically conductive light metal that prevents electrostatic charging of the mark body and can be connected to ground.

16 Claims, 5 Drawing Sheets

FIDUCIAL MARK BODIES FOR CHARGED-PARTICLE-BEAM (CPB) MICROLITHOGRAPHY, METHODS FOR MAKING SAME, AND CPB MICROLITHOGRAPHY APPARATUS COMPRISING SAME

FIELD OF THE INVENTION

The present invention pertains to microlithography apparatus and methods using a charged particle beam (e.g., electron beam or ion beam) as an energy beam for performing transfer-exposure of a pattern from a mask or reticle to a sensitive substrate. Such methods and apparatus are used, for example, in the manufacture of semiconductor integrated circuits and displays. More specifically, the invention pertains to alignment and fiducial marks used in such methods and apparatus, wherein a first such mark is situated as an index mark on a first surface (e.g., reticle surface) and a second such mark is situated as a fiducial (reference) mark on a second surface (e.g., sensitive substrate such as a wafer or the like), and an alignment of the two marks is performed to achieve optimal positioning of the two marks relative to each other.

BACKGROUND OF THE INVENTION

One type of conventional charged-particle-beam (CPB) microlithography (projection-exposure) apparatus utilizes an electron beam to irradiate a pattern defined on a reticle. Electrons of the beam passing through the irradiated region of the reticle are projected and focused onto a sensitized substrate (e.g., semiconductor wafer), thereby "transferring" the pattern from the reticle to the wafer. The reticle is mounted on a reticle stage and the wafer is mounted on a wafer stage. For accurate projection-exposure of the pattern from the reticle to a particular region on the wafer, it is necessary to align accurately the wafer with the substrate. To such end, at least one "alignment mark" (also termed an "index mark") is provided on the reticle or reticle stage, and at least one "fiducial" (reference) mark is provided on the wafer or wafer stage. In a procedure for aligning the wafer with the reticle, the index mark is aligned with the fiducial mark.

More specifically, in a representative conventional method for performing alignments as summarized above, the electron beam is caused to illuminate the index mark on the reticle or reticle stage. Electrons of the beam passing through the index mark are directed as a scanning beam to the fiducial mark on the wafer or wafer stage. Electrons of the beam that are backscattered from the fiducial mark are detected using an appropriate detector, and the relative positional relationship of the projected image of the index mark to the fiducial mark is determined. Based on the determination, the reticle and wafer are aligned as required. Such determinations also can provide data on distortion of the beam, preliminary to making appropriate corrections to the beam.

To obtain accurate determinations as summarized above, it is necessary that the location of the index mark be known accurately relative to, for example, detected positional coordinates of the reticle stage. Similarly, it is necessary that the location of the fiducial mark be accurately known relative to the detected positional coordinates of the wafer stage. Therefore, and in view of the fact that the marks are irradiated by the beam, it is important that the marks be defined on a material having as low a coefficient of thermal expansion as possible so as to undergo minimal thermal deformation when irradiated.

FIG. 1 is a schematic sectional view of a conventional fiducial mark 10 body. A fiducial mark typically is produced by forming a layer of a heavy metal such as Ta or W on the surface of a substrate 11 (made of Si or other suitable material). The elements 12 of the fiducial mark are formed by etching the heavy-metal layer appropriately.

The fiducial mark body 10 of FIG. 1 normally is situated on the wafer or wafer stage and used in conjunction with a corresponding index mark on the reticle or reticle stage. The pattern of the index mark normally is similar to the pattern of the fiducial mark 10. An electron beam irradiates the index mark such that an image of the alignment mark is formed on or near the fiducial mark 10. As the electron beam scans the image of the index mark over the fiducial mark, the relative positions of the marks are determined from an electrical signal produced by a detector of electrons that are backscattered ("backscattered electrons" or BSEs) from the fiducial mark. Based on the signal, an upstream deflector can be energized appropriately to deflect the beam to achieve maximal coincidence of the marks.

In charged-particle-beam (CPB) microlithography, alignment of an index mark with a corresponding fiducial mark can be performed using either an optical-based alignment sensor (i.e., a sensor utilizing light) or a CPB-based alignment sensor (i.e., a sensor sensitive to charged particles such as BSEs from the beam). Especially whenever an optical-based alignment sensor is used, it is necessary to determine, as a calibrated "baseline," the distance between a reference (fiducial) location of the CPB-optical system and a reference (fiducial) location of the optical-based alignment sensor. Since the optical-based alignment sensor is situated usually outside the "column" (vacuum housing) of the CPB-optical system, the distance typically is substantial.

Measurements of distances between fiducial locations can be affected adversely by apparatus vibrations. To eliminate such vibrations, it is necessary to measure simultaneously the reference location of the CPB-optical system and the reference location of the optical-based alignment sensor. The fiducial mark used in baseline measurements should have a length that is at least equal to the baseline length. That is, when an optical-based alignment sensor is used, it is important to measure a "baseline" (distance between the optical axis of the charged particle beam and the optical axis of the optical system of the alignment sensor). To such end, fiducial marks are used that can be measured at the same time. Such marks should extend over the baseline or, if spaced apart from each other at the baseline, overlap each other. However, such marks can be adversely affected easily.

Also, positional stability of the fiducial marks to changes in temperature is very important. By way of example, if the distance between the reference location of the CPB-optical system and the reference location of the optical-based alignment sensor is 20 mm, and the apparatus temperature is controlled to within ±0.5° C., the coefficient of thermal expansion of the substrate on which the fiducial mark is formed should be $1\times10^{-7}/°C$. or less to suppress variations in measured distance between the respective fiducial marks adequately to within 1 nm or less. The coefficient of thermal expansion of Si as currently used as a substrate for fiducial marks is about $2.4\times10^{-5}/°C$., which is unsatisfactorily high for use in obtaining accurate measurement of the distance between fiducial locations.

It has been proposed to manufacture the substrate for a fiducial mark body using a substance having a low coefficient of thermal expansion, such as ZERODUR made by Schott of Germany. However, because ZERODUR is not electrically conductive, an undesirable electrical charge tends to accumulate on it whenever it is irradiated by an electron beam. The accumulated charge forms a corresponding electrical field around the fiducial mark, which can perturb the beam incident on the mark. If substrate charging is excessive, an electrical discharge may occur which can destroy the fiducial mark.

Providing ZERODUR with a conductive metal coating has been proposed to prevent or at least reduce charge accumulation on the substrate. However, such a coating tends to reduce the contrast of the BSE signal.

Therefore, methods are required for preventing charge accumulation on a fiducial mark without adversely reducing contrast and while maintaining the low thermal-expansion characteristic of the fiducial-mark substrate.

SUMMARY OF THE INVENTION

In view of the shortcomings of the prior art as summarized above, the present invention provides, inter alia, fiducial mark bodies that can be used for any of various applications in charged-particle-beam (CPB) microlithography. For example, fiducial mark bodies according to the invention can be used for measuring the distance from a reference position of an electron-optical system and a reference position of an optical-based alignment sensor, as used in a CPB microlithography apparatus.

A first exemplary embodiment of a fiducial mark body is especially suitable for mounting on a wafer stage of a CPB microlithography apparatus. The mark body, defining a fiducial mark, can be used, e.g., for apparatus calibration, reticle alignment with the wafer, etc. Elements (features) of the fiducial marks are defined by respective portions of a layer of heavy metal formed on a substrate plate. The substrate plate is formed of a material having a coefficient of thermal expansion of $10^{-7}/°C$. or less. The substrate plate is coated with a film of an electrically conductive material (other than the heavy metal). By forming the substrate plate of a material having a coefficient of thermal expansion that is $10^{-7}/°C$. or less, measurement errors arising from changes in temperature of the fiducial mark body are reduced to 1 nm or less whenever the fiducial mark is being used for measuring the distance between a reference position of the CPB-optical system of the CPB microlithography apparatus and a reference position of an optical-based alignment sensor. Exemplary materials for the substrate plate include quartz and glass-ceramics such as ZERODUR™.

Materials having a low coefficient of thermal expansion generally are not electrically conductive. As a result, such materials can become charged electrically whenever they are irradiated by a charged particle beam. Such charge accumulation adversely can affect electrons backscattered from a fiducial mark made of such material, thereby adversely affecting the results of measurements performed using such marks. Hence, in this embodiment, the surface of the substrate plate, (other than where the mark elements are formed of heavy metal) is covered with a layer of an electrically conductive "light metal." The light-metal covering prevents charging of the fiducial mark body and allows greater accuracy of measurements performed using the mark body. Also, the light-metal covering exhibits very low production of secondary electrons or backscattered electrons that otherwise would affect measurement results adversely.

Especially desirable "heavy metal" materials for use in defining the mark elements are Ta, W, and Pt. Especially desirable "light metal" materials for use in forming the electrically conductive layer are Ti, Cr, and Al.

The thickness of the light metal layer can be 1 $\mu$m or less. The coefficient of backscattered electrons exhibited by a substance (the coefficient expressing the relative generation of backscattered electrons when the substance is irradiated by a charged particle beam) increases with increased thickness of the substance. When the thickness of the substance reaches a specific thickness for the particular substance, the coefficient reaches a critical value. For the stated light metals, the critical value is reached whenever the thickness is greater than 1 $\mu$m. Hence, by keeping the layer of light metal less than 1 $\mu$m, the coefficient of backscattered electrons is maintained acceptably small so as to produce an acceptably small number of backscattered electrons to avoid adverse effects on measurement accuracy.

A second exemplary embodiment of a fiducial mark body according to the invention is also especially suitable for mounting on the wafer stage. The mark body comprises a substrate plate as summarized above. The mark elements are defined by a layer of heavy metal as summarized above. The substrate plate and mark elements are coated with a layer of an electrically conductive "light metal" as summarized above. As the first exemplary embodiment, the fiducial mark body of the second embodiment is resistant to charging. A charged particle beam incident on the fiducial mark body of this embodiment passes readily through the layer of "light metal" to the mark elements. The layer of "light metal" exhibits very little absorption or scattering of the incident beam so as to produce substantially no adverse effects on measurements performed using the mark.

In a third representative embodiment, the mark elements are defined by respective "thick" regions of heavy metal, and spaces between and outside the mark elements are formed by relatively "thin" regions of heavy metal. Candidate heavy metals are as summarized above. As discussed above with respect to the "light metal," "heavy metal" substances also have respective coefficients of backscattered electrons that increase with increased thickness of the substance. Heavy metals also have respective thicknesses above which production of backscattered electrons exhibits a critical increase. Hence, regions of heavy metal other than the actual mark elements are formed of the heavy metal but at a thickness that is thinner than the critical thickness for the material. The regions of heavy metal forming the mark elements are thicker than the critical thickness. As a result, whenever the mark is irradiated using a charged particle beam, much more production of backscattered electrons is exhibited by the mark elements than by regions between or outside the elements.

By way of example, the mark elements can have a thickness (of heavy metal) of 0.5 $\mu$m or greater, and the other regions of heavy metal can have a thickness of 0.2 $\mu$m or less. In general, the candidate heavy metals generally have a critical thickness ranging from 0.2 to 0.5 $\mu$m. If the thicker portions of the heavy-metal layer are greater than about 5 $\mu$m thick, generation of backscattered electrons reaches a "saturation" level and further increases in thickness exhibit no further differential effect. Hence, the maximum thickness of heavy metal (in regions defining the mark elements) is desirably 5 $\mu$m or less.

In a fourth representative embodiment, a layer of heavy metal (used to define mark elements) is formed on a substrate plate made of a material as summarized above. No heavy metal is present in regions outside the actual mark elements. The entire substrate plate and mark elements are coated with a thin film of an electrically conductive "light metal."

In another representative embodiment, the subject fiducial mark body comprises a substrate plate made of a material having a low coefficient of thermal expansion as summarized above. Mark elements are formed on a surface of the substrate plate of heavy metal. A layer of an electrically conductive material (desirably a "light metal" as summarized above) is provided within the thickness dimension of the substrate plate or on a rear surface of the substrate plate. The layer of electrically conductive material is connected to ground during use of the fiducial mark body. Because the layer of electrically conductive material does not coat the mark elements in this embodiment, any possible effect of the electrically conductive material on mark contrast essentially is eliminated. The fiducial mark body of this embodiment is especially suitable for attachment to the wafer stage of a CPB microlithography apparatus and is resistant to charging.

In this embodiment, the layer of electrically conductive material desirably is configured so as to have minimal effect on the thermal expansion characteristic of the fiducial mark body while preventing charging of the mark body. To such end, for example, the layer of electrically conductive material can be configured as a network. Alternatively, the electrically conductive material can be layered only in regions of the mark body that are irradiated directly by the charged particle beam (not blocked by the mark elements).

According to another aspect of the invention, methods are provided for producing fiducial mark bodies for use in a CPB microlithography apparatus. The fiducial mark bodies produced by the methods are especially suitable for mounting on the wafer stage of the CPB microlithography apparatus, for use in apparatus calibration, reticle alignments, and other uses.

In a representative embodiment of the methods, a substrate plate is coated with a thin film of an electrically conductive "light metal." The substrate plate and light metal are as summarized above. Mark elements are defined by applying a layer of "heavy metal" (as summarized above) and removing portions of the heavy metal not intended to define a mark element.

According to yet another aspect of the invention, CPB microlithography apparatus are provided that comprise a CPB-optical system, an optical-based alignment sensor, and any of the various fiducial mark bodies according to the invention (representative embodiments of which are summarized above). With such an apparatus, the distance from a reference position of the CPB-optical system and a reference position of the optical-based alignment sensor can be measured accurately, thereby facilitating accurate alignments performed using the optical-based alignment sensor.

The foregoing and additional features and advantages of the invention will be more readily apparent from the following detailed description, which proceeds with reference to the accompanying drawings.

DETAILED DESCRIPTION

The invention is described below in the context of representative embodiments. However, it will be appreciated that the invention is not limited to the specific embodiments.

Figure 1:
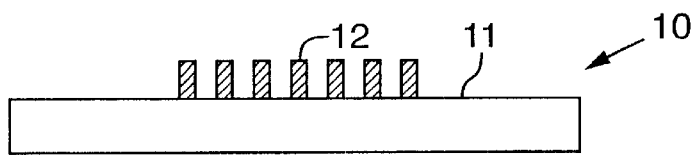
FIG. 1 is a schematic elevational view showing the structure of a conventional fiducial mark body.
Figure 2:
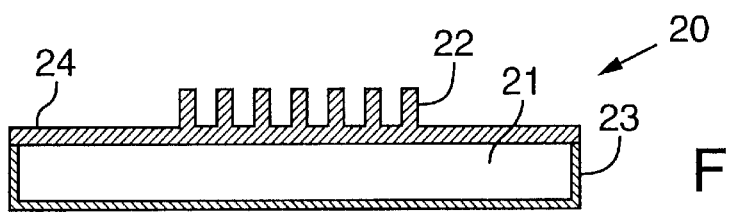
FIG. 2 is a schematic elevational view showing certain aspects of a fiducial mark body according to a first representative embodiment of the invention.

A first representative embodiment of a fiducial mark body according to the invention is depicted schematically in FIG. 2. The fiducial mark 20 comprises a substrate 21 that is coated on all but the upward-facing surface (in the figure) with an electrically conductive material 23. The upward-facing surface (in the figure) of the substrate bears a layer 24 of "heavy" metal. The layer 24 of heavy metal extends further upward in selected regions to define the mark elements 22.

In this embodiment, the substrate 21 is quartz. Surfaces of the quartz substrate 21 not covered by the layer 24 of heavy metal are covered by the coating 23 of electrically conductive material. By way of example, the heavy metal desirably is Ta, W, or Pt. These materials are desirable because they have respective atomic numbers that provide high contrast when irradiated using an electron beam. Also, irradiation of such materials using an electron beam causes no effect on the wafer, and they are easy to process.

The thickness dimension (vertical dimension in the figure) of the elements 22 is 0.5 $\mu$m or greater, and of the intervening layer 24 of heavy metal is 0.2 $\mu$m or less. There is a large difference in the number of BSEs produced by impingement of a charged particle beam on the elements 22 of the mark compared to the intervening layer 24 of heavy metal. Hence, sufficient contrast can be obtained.

To fabricate the fiducial mark body of FIG. 2, the electrically conductive coating 23 is formed as a film on the entire surface of substrate plate 21. The coating on the upward-facing surface (in the figure) is removed by etching. Afterward, the bare upward-facing surface of the substrate 21 is coated with a thick layer of heavy metal. The elements 22 are defined in the heavy metal layer by etching away most of the heavy metal surrounding the elements 22, thereby leaving a relatively thin intervening layer 24 of heavy metal.

Figure 3:
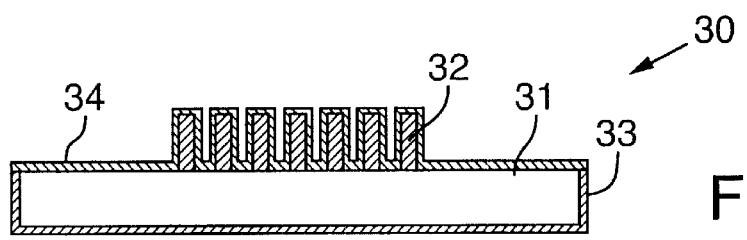
FIG. 3 is a schematic elevational view showing certain aspects of a fiducial mark body according to a second representative embodiment.

A second representative embodiment of a fidicial mark body 30 according to the invention is depicted schematically in FIG. 3. In this embodiment, the mark elements 32 (formed of heavy metal as described above) are formed on the upward-facing (in the figure) surface of a substrate plate 31. The substrate plate 31 desirably is made of a glass-ceramic having a low coefficient of thermal expansion ($1\times10^{-7}/°C$. or less). The upward-facing surface (in the figure) of the substrate plate 31, and the mark elements 32, are coated with a thin film 34 of a "light" metal. The light metal desirably is selected from Ti, Cr, or Al. These elements produce relatively few BSEs, are not magnetic, and are easy to process. The sides and downward-facing (in the figure) surface of the substrate plate 31 have a coating 33 of an electrically conductive material. The thickness of the heavy metal elements 32 of the mark is 0.5 μm or greater, and the film thickness of the layer 34 of light metal is 1 μm or less.

To fabricate the fiducial mark body 30 of FIG. 3, the coating 33 of electrically conductive material is formed as a film on the entire surface of the substrate plate 31. The electrically conductive material is removed by etching from the upward-facing surface (in the figure) of the substrate plate 31, after which the bare upward-facing surface is coated with a thick layer of heavy metal. Heavy metal in regions not destined to define mark elements 32 is removed by etching. Then, a film of light metal 43 is formed on the bare upward-facing surface of the substrate plate 31 and on the elements 32.

Figure 4:
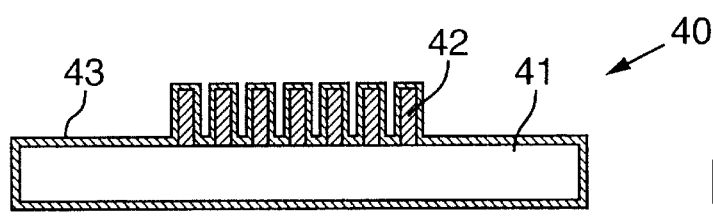
FIG. 4 is a schematic elevational view showing certain aspects of a fiducial mark body according to a third representative embodiment.

A third representative embodiment of a fiducial mark body 40 according to the invention is depicted schematically in FIG. 4. In this embodiment, the mark elements 42 (formed of heavy metal as described above) are formed on the upward-facing (in the figure) surface of a substrate plate 41. The substrate plate 41 desirably is made of a glass-ceramic having a low coefficient of thermal expansion ($1\times10^{-7}/°C$. or less). A coating 43 of an electrically conductive material is formed over the surface of the substrate plate 41 and mark elements 42.

To fabricate the fiducial mark body 40 of FIG. 4, the coating 43 of electrically conductive material is formed over the entire surface of the substrate plate 41. The coating 43 on the upward-facing surface (in the figure) is removed by etching, after which a thick layer of heavy metal is applied. The mark elements 42 are defined in the heavy metal layer by etching away other portions of the heavy metal. Afterward, the coating 43 of electrically conductive material is formed over the bare surfaces of the substrate 41 and elements 42, thereby completely covering the substrate plate 41.

Figure 5:
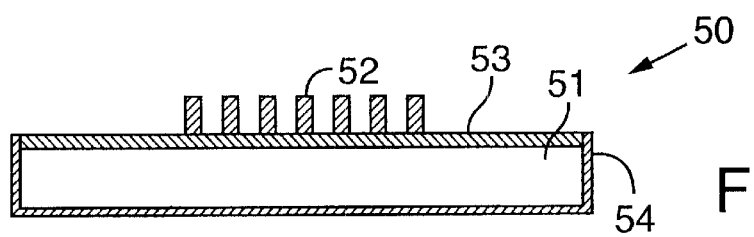
FIG. 5 is a schematic elevational view showing certain aspects of a fiducial mark body according to a fourth representative embodiment.

A fourth representative embodiment of a fiducial mark body 50 according to the invention is schematically depicted in FIG. 5. In this embodiment, the substrate plate 51 desirably is made of a glass-ceramic having a low coefficient of thermal expansion ($1\times10^{-7}/°C$. or less). A thin film 53 of light metal is formed on the upward-facing surface (in the figure) of the substrate plate 51. A pattern of mark elements 52, made of a heavy metal, is formed on the film 53 of light metal. Surfaces of the substrate plate 51 not covered by the film 53 of light metal are covered by a layer 54 of electrically conductive material. A substance exhibiting high adhesion to the substrate plate 51 is interposed between the substrate plate 51 and the elements 52, thereby increasing the stability of the heavy metal elements 52. Such a substance can be the layer of "light metal" 53. (Cr, as an exemplary light metal, is especially useful for this purpose.)

To fabricate the fiducial mark body 50 of FIG. 5, a coating 53 of electrically conductive material is formed on the entire surface of the substrate plate 51. The coating on the upward-facing (in the figure) surface is removed by etching, and a coating 53 of light metal is applied to the upward-facing surface. Then, a thick layer of heavy metal is applied to the upward-facing surface. The mark elements 52 are defined in the heavy metal layer by removing (etching away) surrounding regions of heavy metal.

Figure 6:
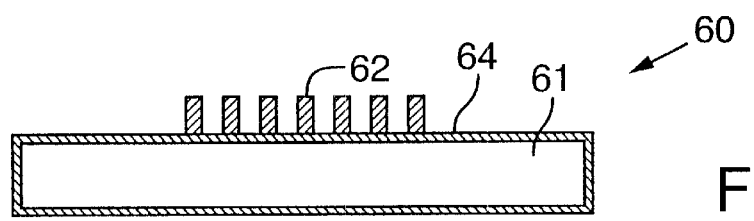
FIG. 6 is a schematic elevational view showing certain aspects of a fiducial mark body according to a fifth representative embodiment.

A fifth representative embodiment of a fiducial mark body 60 according to the invention is depicted schematically in FIG. 6. In this embodiment, the entire surface of a quartz substrate plate 61 is covered with a layer 64 of electrically conductive material. Mark features 62, formed of heavy metal, are formed on the upward-facing (in the figure) surface of the layer 64 of electrically conductive material.

To fabricate the fiducial mark body 60 of FIG. 6, a coating 64 of electrically conductive material is formed on all the surfaces of the quartz substrate plate 61. Then, a thick layer of heavy metal is applied to the upward-facing surface and etched to form the mark elements 62.

In the embodiments of FIGS. 4 and 5, the electrically conductive material can be a "light" metal as defined above.

A fiducial mark according to any of the representative embodiments described above provides a reduced measurement error that would otherwise be caused by thermal changes. Specifically, the measurement error arising from thermal changes is now reduced to 1 nm or less in the context of measuring the distance between a reference location of an electron-optical system and a reference location of an optical-based alignment sensor. The fiducial mark also exhibits no charge accumulation, allowing accurate measurements of mark positions. Fiducial mark bodies, as described above, that include an electrically conductive film produce few BSEs from the electrically conductive film, thereby providing greater accuracy in measurements of the positions of the marks.

Figure 7:
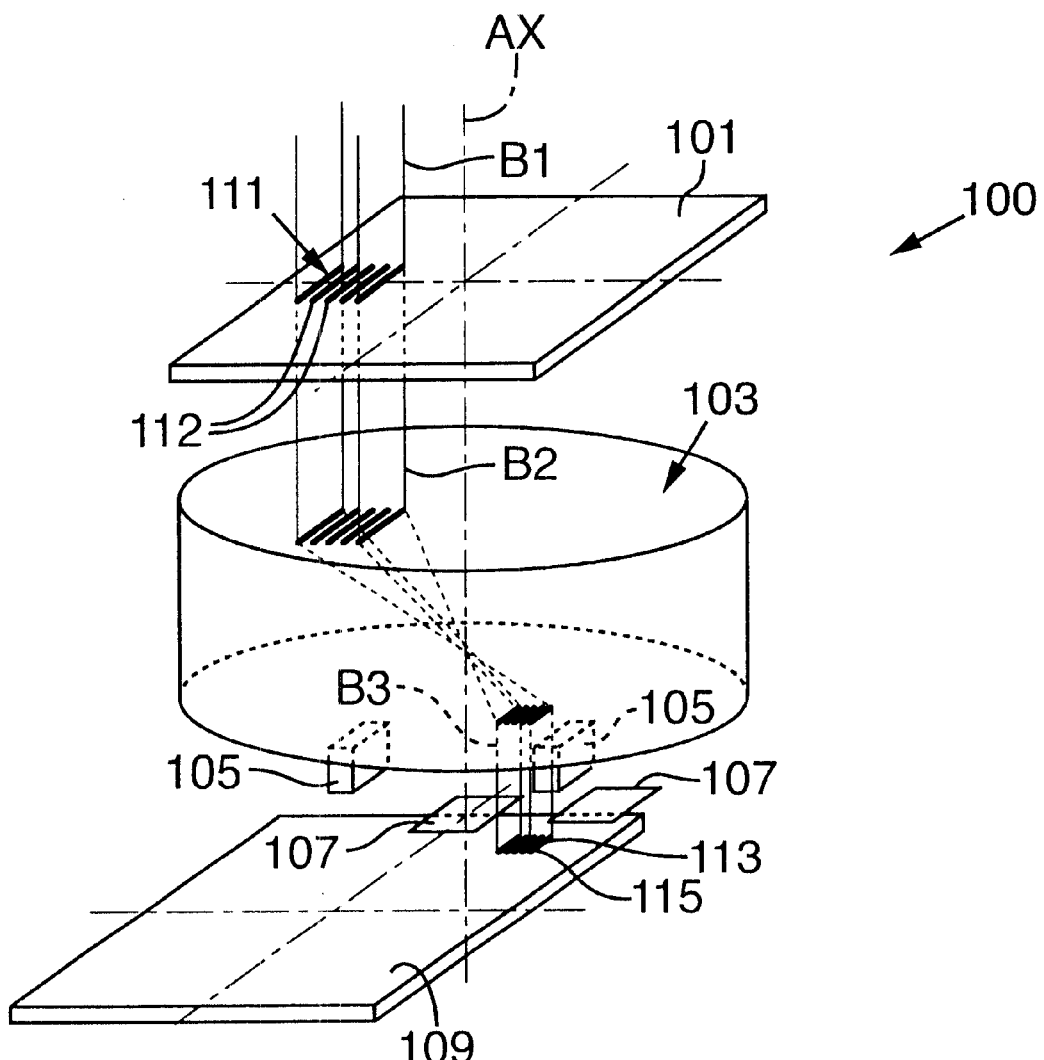
FIG. 7 is an oblique elevational view of certain aspects of a charged-particle-beam microlithography apparatus according to the invention.

Certain aspects of a representative embodiment of an electron-beam (as a representative charged particle beam) microlithography apparatus according to the invention are shown in FIG. 7. The apparatus 100 comprises a reticle stage 101 situated perpendicularly to an optical axis AX. The reticle stage 101 receives an "illumination beam" B1 produced upstream and propagating through an illumination-optical system (not shown, but understood to be located upstream of the reticle stage 101). The reticle stage 101 comprises an index mark 111 comprising an array of elements 112 (five linearly extended elements 112 are shown, by way of example). The elements 112 are defined as corresponding voids in the reticle stage or in a reticle on the reticle stage 101. The illumination beam B1 passes through the elements 112 of the index mark 111 to form a "patterned beam" B2 that propagates downstream of the reticle stage 109.

A projection-optical system 103 is situated on the axis AX downstream of the reticle stage 101. As is known generally, the projection-optical system 103 comprises electromagnetic lenses, dynamic focus coils, astigmatic correction coils, magnification-adjustment coils, rotation adjustment coils, etc. (not shown). As the patterned beam B2 passes through the projection-optical system 103, the projection-optical system inverts and demagnifies the patterned beam to form a "focused beam" B3 that is focused on the wafer stage 109.

A deflector 105 is disposed within or below the projection-optical system 103. The deflector 105 deflects the focused beam B3 using an electrostatic field or a magnetic field (depending upon the configuration of the deflector 105), causing the focused beam B3 to impinge at a desired location on the wafer stage 109. Thus, the beam B3 forms a focused image 113 of the index mark 111 on the wafer stage 109 such that the image 113 can irradiate a fiducial mark 115 formed on the wafer stage 109.

A backscattered-electron (BSE) detector 107 is disposed upstream of the wafer stage 109. The BSE detector 107 detects backscattered electrons produced whenever the focused beam B3 impinges on the fiducial mark 115 on the wafer stage 109. The positional relationship of the image 113 of the index mark relative to the fiducial mark 115 can be measured by processing the signal produced by the BSE detector 107.

Figure 8A:
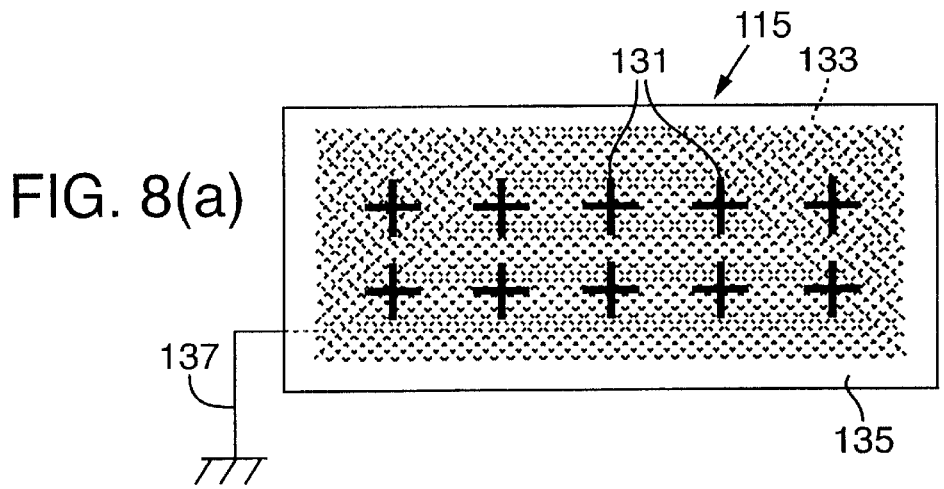
FIGS. 8(a)–8(b) are a schematic plan view and a schematic elevational view, respectively, of a sixth representative embodiment of a fiducial mark body according to the invention.
Figure 8B:
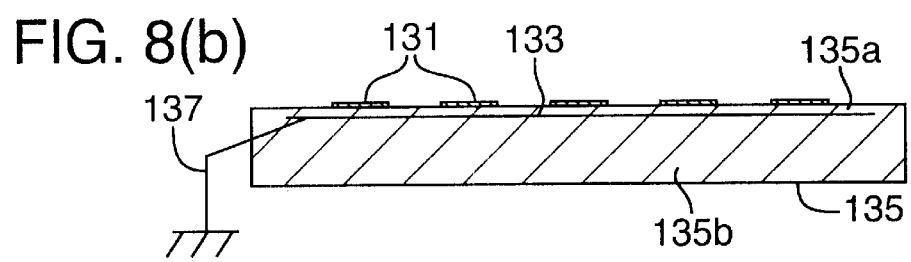

FIGS. 8(a)–(b) schematically show certain details of a sixth representative embodiment of a fiducial mark according to the invention. FIG. 8(a) is a plan view of the mark and FIG. 8(b) is an elevational sectional view of the mark. The fiducial mark 115 comprises a substrate 135 made of a material having a low coefficient of thermal expansion (e.g., ZERODUR manufactured by Schott). Mark elements 131 are made of a heavy metal (W, Ta, or the like as described above) formed as described above on the substrate 135. In this example, each mark element 131 is cross-shaped.

A network 133 of electrically conductive lines (collectively forming the layer, as described above, of an electrically conductive material) is situated inside (within the thickness dimension of) the substrate 135. The electrically conductive material is configured in this manner in this embodiment because such a configuration minimizes the buried area and provides reduced interference with the thermal expansion characteristics of the substrate 135.

A ground conductor 137 is connected to the network 133 of electrically conductive lines. Electrons of an electron beam incident upon the fiducial mark 115 that are captured by the network 33 of electrically conductive material flow to the ground conductor 137, thereby avoiding accumulation of electrical charge on the fiducial mark 115.

Within the thickness dimension of the substrate 135, an effective depth at which the network 133 of electrically conductive lines is situated is desirably a few tens of pm. The specific depth can be determined through experiment, taking into account the acceleration voltage of the electron beam and the following additional considerations:

(1) The network 133 is desirably deep enough (in the thickness dimension relative to the surface of the substrate 135) to avoid reducing the contrast of the BSE signal from the fiducial mark. I.e., since reduction in contrast can arise from backscattering of electrons from the network 133, the depth should be sufficiently deep to prevent most or substantially all such backscattering.

(2) The network 133 is desirably shallow enough so that electrons incident upon the fiducial mark are shunted readily to ground so as to avoid electrostatic charging of the mark.

The fiducial mark 115 of FIGS. 8(a)–8(b) is fabricated by "burying" the network 133 of lines of electrically conductive material in the substrate 135 when forming the substrate 135. Specifically, the network 133 desirably is formed on a surface of a substrate base layer 135b, following by formation of an overlay 135a of the substrate material on the network 133.

Figure 9A:
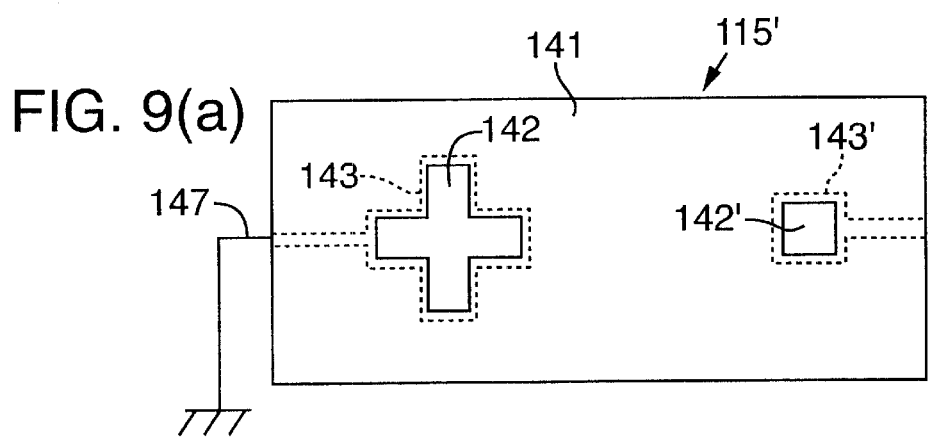
FIGS. 9(a)–9(b) are a schematic plan view and a schematic elevational view, respectively, of a seventh representative embodiment of a fiducial mark body according to the invention.
Figure 9B:
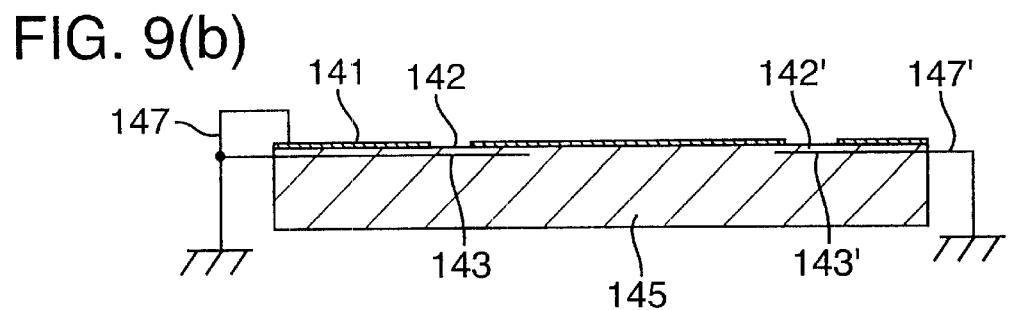

FIGS. 9(a)–9(b) depict details of a seventh representative embodiment of a fiducial mark 115' according to the invention. FIG. 9(a) is a plan view and FIG. 9(b) is an elevational sectional view of the mark. The fiducial mark 115' comprises a layer 141 of a metal such as Cr formed on the surface of a substrate 145. The layer 141 is absent in certain regions so as to define respective mark "apertures" 142 (that define respective mark elements). Thus, at the mark apertures 142, the substrate 145 is bare. A layer 143 of an electrically conductive material is formed "below" (within the thickness dimension of the substrate 145) the mark apertures 142. Each respective layer 143 is configured with the same shape and slightly larger than the respective mark aperture 142.

In FIG. 9(a), the left-hand mark aperture 142 and electrically conductive layer 143 are cross-shaped, and the right-hand mark aperture 142' and electrically conductive layer 143' are square-shaped. Each region 143, 143' of electrically conductive material is connected via a respective conductor 147, 147' to ground. Also connected to the conductor 147 is a surficial layer 141 of electrically conductive material.

The substrate 145 desirably is made of ZERODUR. The regions 143, 143' of electrically conductive material can be configured and situated to have optimal shapes relative to the corresponding mark elements 142, 142' so that local ground loops and the like are not created. Ground loops are not desired because, if a ground loop exists and an electrical potential difference arises in the loop, electrical current may flow and harmful magnetic fields may be created thereby. Such fields can generate noise in the ground line.

Next, an example of using a microlithographic exposure apparatus according to the invention is explained.

Figure 10:
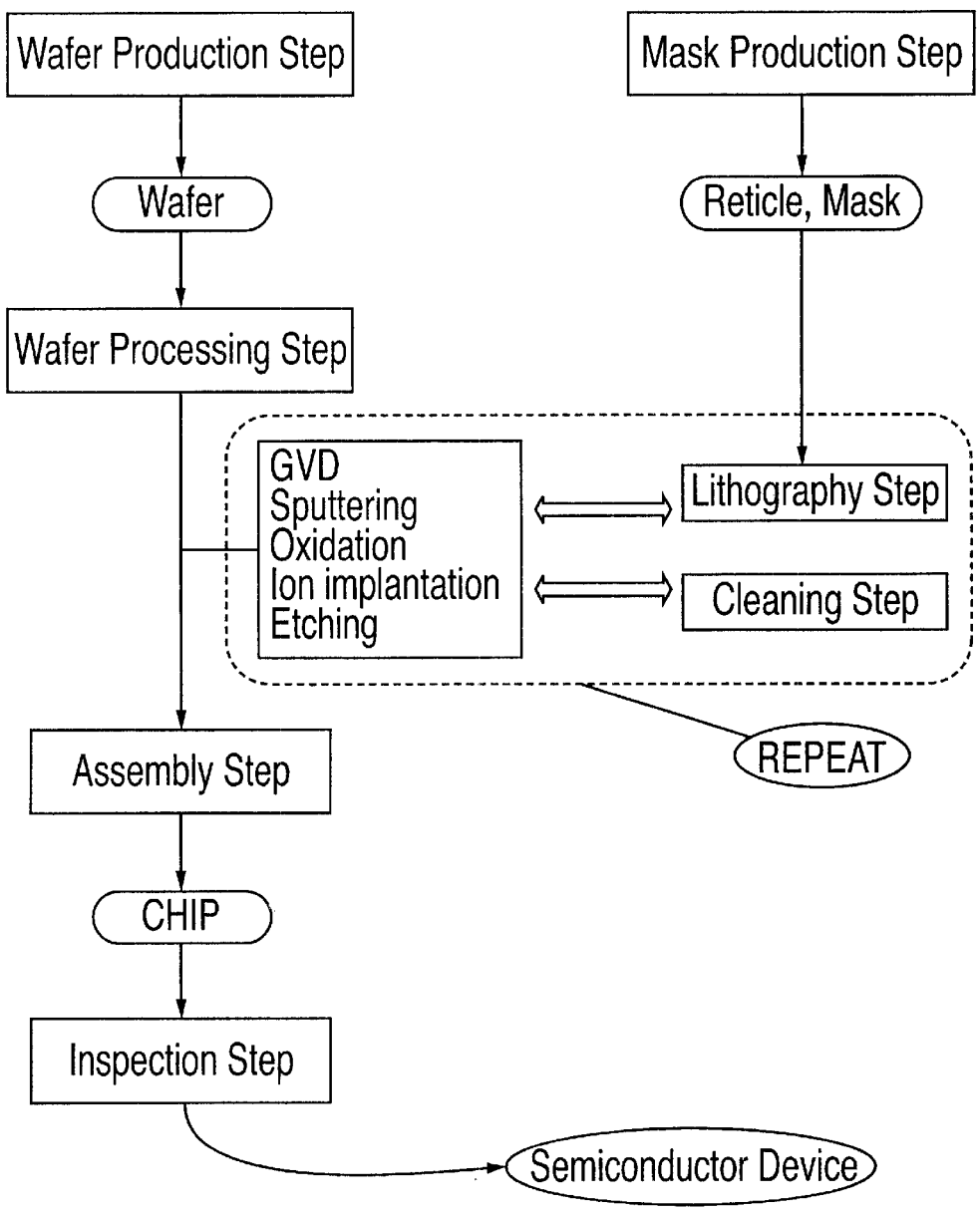
FIG. 10 is a process flowchart for manufacturing a semiconductor device, wherein the process includes a microlithography method according to the invention.

FIG. 10 is a flowchart of an exemplary semiconductor fabrication method to which apparatus and methods according to the invention can be applied readily. The fabrication method generally comprises the main steps of wafer production (wafer preparation), reticle production (reticle preparation), wafer processing, device assembly, and inspection. Each step usually comprises several sub-steps.

Among the main steps, wafer processing is key to achieving the smallest feature sizes (critical dimensions) and best inter-layer registration. In the wafer-processing step, multiple circuit patterns are successively layered atop one another on the wafer, wherein the formation of each layer typically involves multiple sub-steps. Usually, many operative semiconductor devices are produced on each wafer.

Typical wafer-processing steps include: (1) thin-film formation involving formation of a dielectric layer for electrical insulation or a metal layer for connecting wires; (2) microlithography to form a resist pattern for selective processing of the thin film or the substrate itself; (3) etching or analogous step to etch the thin film or substrate according to the resist pattern, or doping as required to implant ions or impurities into the thin film or substrate according to the resist pattern; (4) resist stripping to remove the resist from the wafer; and (5) chip inspection. Wafer processing is repeated as required (typically many times) to fabricate the desired semiconductor chips on the wafer.

Figure 11:
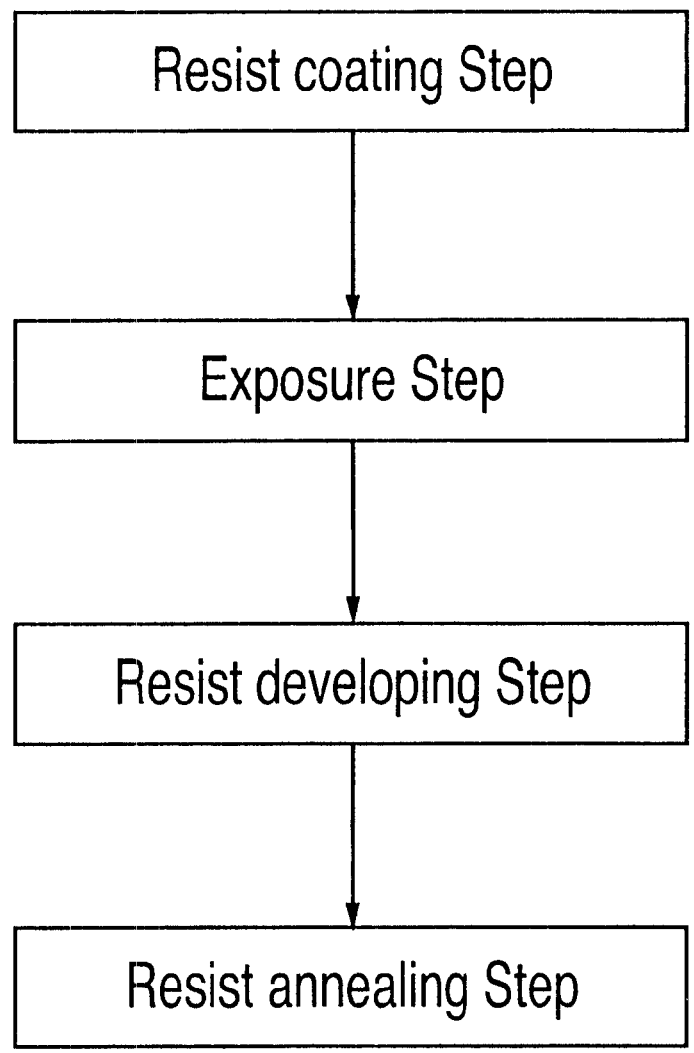
FIG. 11 is a process flowchart for performing a microlithography method that includes a projection-exposure method according to the invention.

FIG. 11 provides a flow chart of typical steps performed in microlithography, which is a principal step in wafer processing. The microlithography step typically includes: (1) a resist-coating step, wherein a suitable resist is coated on the wafer substrate (which can include a circuit element formed in a previous wafer-processing step; (2) an exposure step, to expose the resist with the desired pattern; (3) a development step, to develop the exposed resist; and (4) an optional annealing step, to enhance the durability of the resist pattern.

Methods and apparatus according to the invention can be applied to a semiconductor fabrication process, as summarized above, to provide a substantially improved process. Specifically, smaller minimum linewidths and better overlap accuracy are achieved in the microlithography steps.

Whereas the invention has been described in connection with multiple representative embodiments, it will be understood that the invention is not limited to those embodiments. On the contrary, the invention is intended to encompass all modifications, alternatives, and equivalents as may be included within the spirit and scope of the invention as defined by the appended claims.

What is claimed is:

1. A fiducial mark body for placement on a wafer stage of a charged-particle-beam (CPB) microlithography apparatus and used to perform alignments of said apparatus, the fiducial mark body comprising:
    a substrate plate made of a material having a coefficient of thermal expansion of $10^{-7}/°C$. or less;
    mark elements formed of a heavy metal formed on a surface of the substrate plate; and
    a layer of an electrically conductive material on at least one surface of the substrate plate not covered by the mark elements.

2. The fiducial mark body of claim 1, wherein:
    the heavy metal is Ta, W, or Pt; and
    the electrically conductive material is a light metal having a thickness of no greater than 1 μm, the light metal being Ti, Cr, or Al.

3. The fiducial mark body of claim 1, wherein:
    the heavy metal of the mark elements has a first thickness; and
    the mark elements are surrounded by a layer of heavy metal having a second thickness that is less than the first thickness.

4. The fiducial mark body of claim 3, wherein:
    the first thickness is 0.5 μm or greater; and
    the second thickness is 0.2 μm or less.

5. The fiducial mark body of claim 1, wherein the layer of electrically conductive material also extends between the mark elements and the substrate plate.

6. A fiducial mark body for placement on a wafer stage of a charged-particle-beam (CPB) microlithography apparatus and used to perform alignments of said apparatus, the fiducial mark body comprising:
    a substrate plate made of a material having a coefficient of thermal expansion of $10^{-7}/°C$. or less;
    mark elements formed of a heavy metal formed on a surface of the substrate plate; and
    a layer of an electrically conductive material covering the substrate plate and mark elements.

7. The fiducial mark body of claim 6, wherein:
    the heavy metal is Ta, W, or Pt; and
    the electrically conductive material is a light metal having a thickness of no greater than 1 μm, the light metal being Ti, Cr, or Al.

8. The fiducial mark body of claim 6, wherein:
    the heavy metal of the mark elements has a first thickness; and
    the mark elements are surrounded by a layer of heavy metal having a second thickness that is less than the first thickness.

9. The fiducial mark body of claim 8, wherein:
    the first thickness is 0.5 μm or greater; and
    the second thickness is 0.2 μm or less.

10. A charged-particle-beam microlithography apparatus, comprising a fiducial mark body as recited in any one of claims 1–9.

11. A fiducial mark body for placement on a wafer stage of a charged-particle-beam (CPB) microlithography apparatus and used to perform alignments of said apparatus, the fiducial mark body comprising:
    a substrate plate having substantially no electrical conductivity and a coefficient of thermal expansion of $10^{-7}/°C$. or less;
    mark elements situated on a surface of the substrate plate so as to be exposed to a charged particle beam during use of the fiducial mark body; and
    a layer of an electrically conductive material inside a thickness dimension of the substrate plate or on a rear surface of the substrate plate, the layer of electrically conductive material being electrically grounded during use of the fiducial mark body.

12. The fiducial mark body of claim 11, wherein the layer of electrically conductive material is configured as a network.

13. The fiducial mark body of claim 11, wherein the mark elements are configured as apertures in a metal layer on the surface of the substrate plate.

14. The fiducial mark body of claim 13, wherein the layer of electrically conductive material is situated so as to be irradiated directly by a charged particle beam passing through the apertures.

15. The fiducial mark body of claim 11, wherein the layer of electrically conductive material is configured to have substantially no effect on thermal expansion of the fiducial mark body.

16. A charged-particle-beam microlithography apparatus comprising a fiducial mark body as recited in any of claims 11–15.

* * * * *

UNITED STATES PATENT AND TRADEMARK OFFICE
CERTIFICATE OF CORRECTION

PATENT NO.   : 6,429,090 B1
DATED        : August 6, 2002
INVENTOR(S)  : Fujiwara et al.

It is certified that error appears in the above-identified patent and that said Letters Patent is hereby corrected as shown below:

Column 2,
Line 1, "mark 10 body" should be -- mark body 10 --.

Column 6,
Line 65, "fidicial" should be -- fiducial --.

Column 7,
Line 23, "43" should be -- 34 --.

Column 8,
Line 51, "109" should be -- 101 --.

Column 9,
Line 39, "pm" should be -- µm --.

Signed and Sealed this

Twenty-fourth Day of June, 2003

JAMES E. ROGAN
*Director of the United States Patent and Trademark Office*